United States Patent [19]

Garpendahl et al.

[11] 4,352,060
[45] Sep. 28, 1982

[54] APPARATUS FOR MEASURING THE INTERIOR DIMENSIONS OF A CAST IRON MOLD

[75] Inventors: Gunnar Garpendahl, Åkersberga; Ingrid Bruce, Stockholm; Ebbe Lundmark, Boden, all of Sweden

[73] Assignee: Viak AB, Boden, Sweden

[21] Appl. No.: 164,900

[22] Filed: Jul. 1, 1980

[51] Int. Cl.³ ............................................. G01R 27/26
[52] U.S. Cl. .............................. 324/61 R; 324/61 QS
[58] Field of Search ................ 324/61 R, 61 P, 61 QS

[56] References Cited

U.S. PATENT DOCUMENTS

| | | | |
|---|---|---|---|
| 2,177,528 | 10/1939 | Kidd | 324/61 QS |
| 3,353,098 | 11/1967 | Foster et al. | 324/61 QS |
| 3,400,331 | 9/1968 | Harris | 324/61 QS |
| 3,748,577 | 7/1973 | Jones, Jr. | 324/61 R |
| 3,867,691 | 2/1975 | Plessis | 324/61 R |
| 4,112,355 | 9/1978 | Gibson, Jr. et al. | 324/61 R X |
| 4,168,465 | 9/1979 | Prince | 324/61 P |

FOREIGN PATENT DOCUMENTS 2841600  8/1979  Fed. Rep. of Germany .... 324/61 R

*Primary Examiner*—Stanley T. Krawczewicz
*Attorney, Agent, or Firm*—Burns, Doane, Swecker & Mathis

[57] ABSTRACT

A device for measuring the inside dimensions of a cast iron mold includes a measuring device movably arranged inside the cast iron mold on one or several guide rails. The measuring device comprises a rim with plates, each of which forms a capacitor together with an adjacent portion of the mold wall. An electronic unit for generating and subsequently processing signals corresponding to the capacitances of the separate capacitors provides an indication of the interior dimensions of the mold, based upon the capacitance measurements.

3 Claims, 4 Drawing Figures

APPARATUS FOR MEASURING THE INTERIOR DIMENSIONS OF A CAST IRON MOLD

BACKGROUND OF THE INVENTION

The present invention relates to a device for measuring the inside dimensions of a cast iron or other metallic mold, and more particularly to a device for measuring the inside dimensions of a mold using capacitance measurements.

A cast iron mold for use in a continuous casting process is required to meet relatively strict tolerance demands with respect to its inside dimensions. A typical embodiment of a cast iron mold is a relatively long curved tube having square or rectangular cross section.

Known methods for measuring cast iron molds utilize mechanical measuring instruments. These methods are disadvantageous in that they are relatively slow and they do not always provide a reliable measurement of the cast iron mold when it is mounted in place for use in a continuous casting plant.

OBJECTS AND BRIEF SUMMARY OF THE INVENTION

It is therefore an object of the present invention to provide a novel measuring device for cast iron molds which provides a quick and reliable measurement of mold dimensions when the mold is mounted in a continuous casting plant.

It is a further object of the present invention to provide such a measurement device that can also be used in a workshop for cast iron molds, for adjustment and control purposes during the production of cast iron molds.

According to the present invention, a measuring device is disposed within the cast iron mold and movable along one or more guide rails. The measuring device includes a rim with plates, each plate forming a capacitor together with an adjacent portion of the mold wall. An electronic control unit on the device generates, and subsequently processes, signals indicating the capacitances of the individual capacitors.

The capacitors formed in part by the mold wall are preferably incorporated in oscillating circuits. Signals corresponding to the respective capacitances of the separate capacitors can be derived from the resonant frequencies of the oscillating circuits.

To make a cast iron mold of rectangular or square cross section, the measureing device according to the invention is preferably provided with a number of plates for each mold wall. The plates are disposed besides each other parallel to the wall, and opposite plates on the rim are connected in pairs in oscillating circuits.

BRIEF DESCRIPTION OF THE DRAWINGS

An illustrative example of the present invention will be described in detail in the following description with reference to the accompanying drawings wherein.

DETAILED DESCRIPTION

Figure 1:
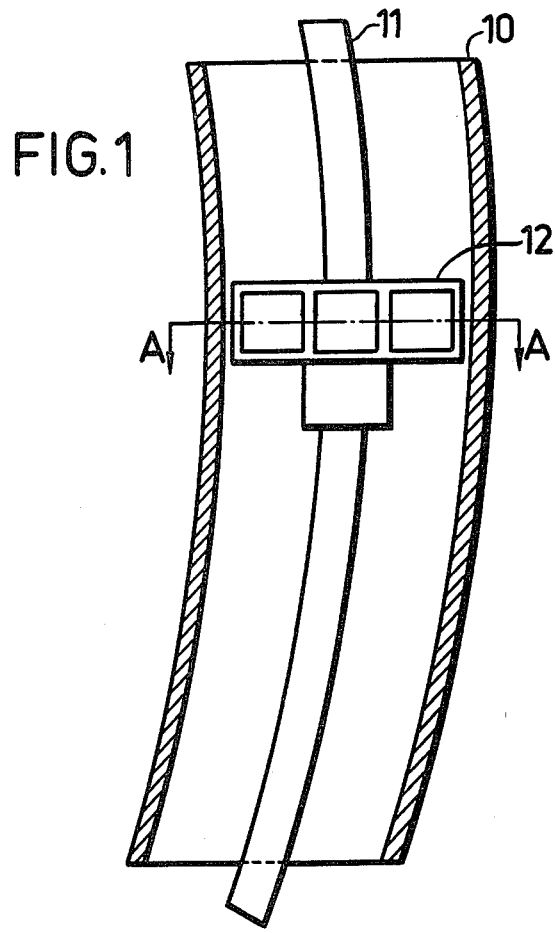
FIG. 1 is a sectional side view of a cast iron mold having a measuring device, constructed according to the present invention, disposed therein.

Referring to FIG. 1, a cast iron mold 10 comprises a long tube of square or rectangular cross section, and can be, for example 700 mm in length. The tube has the same radius of curvature as the continuous casting path, e.g. 6 m.

When measuring the interior dimensions of the mold, a guide rail 11 of the same curvature as the mold is disposed in the mold 10. The guide rail is secured at both ends so that it follows the center line of the cast iron mold.

On the guide rail 11 is arranged a movable slide with a measuring means 12. The measuring means 12 comprises a rim with conductive plates for providing capacitive measurement of the inside dimensions of the cast iron mold. The measuring means also includes an electronic unit (not shown) for supplying voltage to the measuring means and a circuit for processing the signals obtained from the capacitive measurement.

Figure 2:
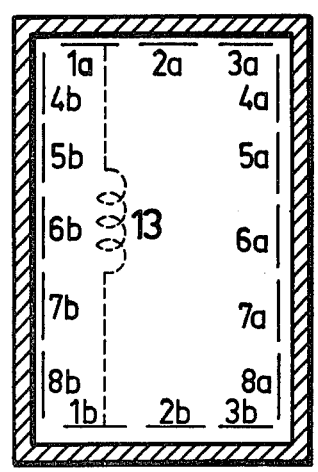
FIG. 2 is a sectional view through the mold and the measuring device along the line A-A of FIG. 1.

As shown in FIG. 2, which is a sectional view through the cast iron mold 10 and the plates of the measuring means 12, the measuring means for each mold wall is provided with a number of plates arranged adjacent each other parallel to the wall. The measuring means shown in FIG. 2 comprises 16 plates $1a$ to $8a$ and $1b$ to $8b$, which are distributed proximate the four walls of the mold in the manner shown in the drawing.

The plates are arranged at a relatively short distance from the mold wall, preferably about 2 to 3 mm. Since the capacitance of the capacitor formed by one plate and the adjacent portion of the mold wall is a function of this distance, the dimensions of the mold can be obtained from a capacitance measurement. By connecting the separate capacitors formed in part by the mold walls in oscillating circuits, the capacitance measurement can be performed via a frequency determination measurement. If opposite plates are connected in pairs, a minor eccentricity of the guide rail with respect to the center line of the mold will be cancelled by the oppositely connected capacitors and will not influence the measurement result.

For the sake of clarity, only one oscillating circuit is indicated in FIG. 2. The oscillating circuit comprises an oscillator coil 13, having an inductance L, connected to the plates $1a$ and $1b$ of the measuring means. Such an oscillating circuit is an oscillator of Colpitt type, the capacitance C of which is defined as $$C = \frac{1}{1/C_a + 1/C_b}$$

where $C_a$ is the capacitance between the plate $1a$ and the adjacent portion of the mold wall and $C_b$ is the capacitance between the plate $1b$ and the adjacent portion of the mold wall.

Assuming that the plates $1a$ and $1b$ have the same plate area A, and at a certain measuring point along the length of the mold are at a distance $d_a$ and $d_b$, respectively, from the adjacent mold wall, the previously defined relationship can be written as $$C = \epsilon \epsilon_0 \frac{A}{d_a + d_b}$$

where $\epsilon$ and $\epsilon_0$ are dielectric constants.

The resonance frequency f of the oscillating circuit is thus defined as $$f = \frac{1}{2\pi\sqrt{LC}} = k\sqrt{d_a + d_b}$$

where k is a constant. Variations in resonance frequency of the oscillating circuit, as the measuring means 12 is moved through the cast iron mold 10, thus correspond to the variations of the inside dimensions of the mold. In the present illustrative example, where 16 plates 1a to 8a and 1b to 8b are connected in pairs via osscillator coils to form eight oscillators of Colpitt type, 16 measuring points per mold cross section are obtained, which is sufficient for measuring a big mold. Measurements can be performed, for example, at every 25-30 mm along the vertical distance of the mold, which gives about 30 measurements for a mold of 700 mm length.

Figure 3:
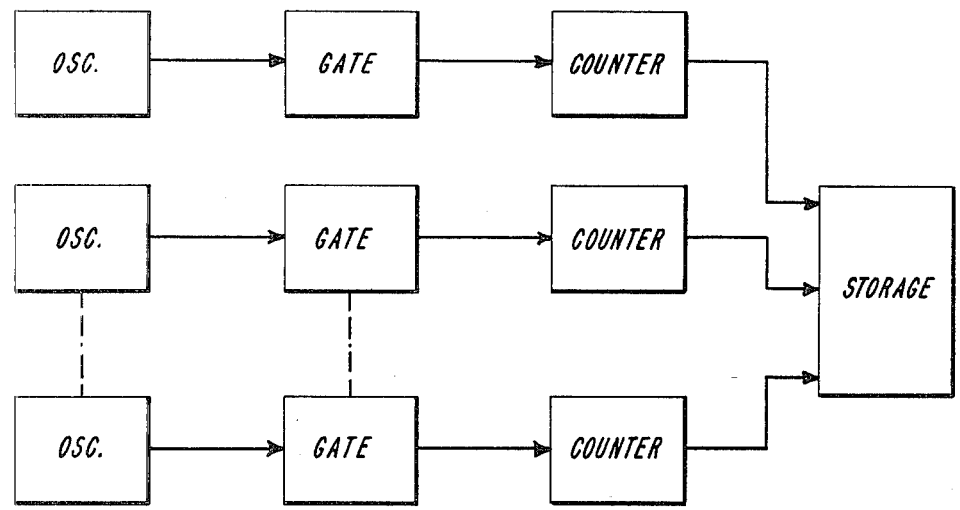
FIGS. 3 and 4 are block diagrams illustrating alternative embodiments of processing circuits which can be utilized with the present invention.

A variety of conventional signal processing circuits can be utilized to determine the resonance frequency of each oscillating circuit, and hence the interior dimensions of the mold. For example, as illustrated in FIG. 3, the signal from each oscillator can be supplied to a separate counter via a gate. This gate can be enabled, for example, by means of a signal from an optically or electronically readable marking on the guide rail and be kept enabled for a predetermined time during which the counter is advanced stepwise by the signal from its associated oscillating circuit. When the gate has been disabled, the contents of the counter, indicative of the resonance frequency of the oscillating circuit, is transferred to a storage device and the counter is reset.

Figure 4:
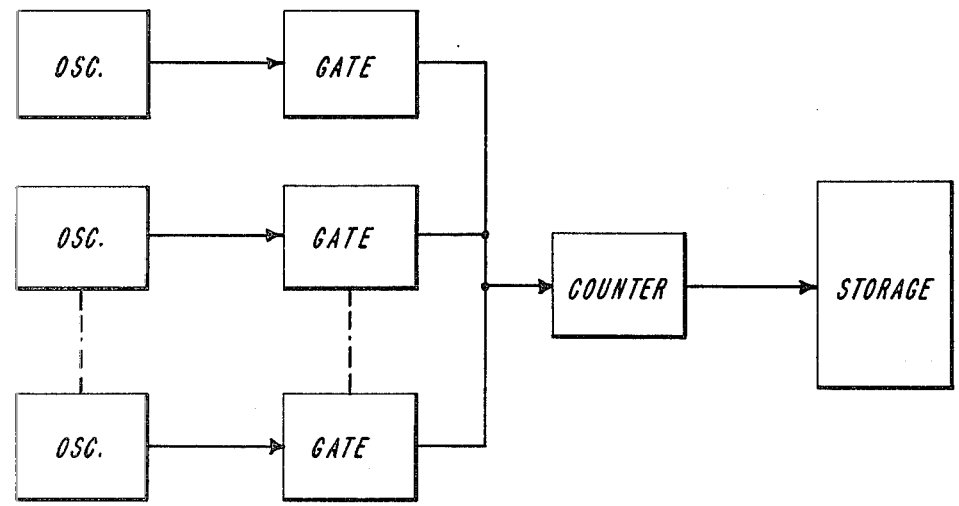

It is also possible, as illustrated in FIG. 4, to utilize only one single counter in the processing circuitry and to connect the various oscillators to this counter one at a time by means of suitable switching or gating devices.

After taking the measuring device out of the cast iron mold, the processing circuitry can be connected to a printer or a display unit where the contents of the storage device is displayed after any necessary calculation to determine an absolute dimension measure or a deviation from nominal measure. The stoage device can be made large enough to store data from several cast iron molds. The measurement results can also be fed directly from the processing circuitry to a printer or a display unit for display thereof.

The processing circuitry is preferably battery-operated, which eliminates the need for an electrical supply cable to the movable measuring means.

The present invention may be embodiment in other specific forms without departing from the spirit or essential characteristics thereof. The presently disclosed embodiment is therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. Apparatus for measuring the interior dimensions of a metallic mold having a rectangular cross-section, comprising:
   a guide rail adapted to be disposed within a mold, said guide rail having approximately the same curvature as a mold to be measured and being adapted to be secured at along the center line of the mold to be measured; and
   a measuring means mounted for movement along said rail, said measuring means including:
      a multiplicity of plates mounted on a rim with a plurality of said plates being disposed adjacent the interior of each mold wall such that each plate forms a capacitor together with the adjacent portion of said mold wall, the plates of each wall being arranged adjacent each other parallel to the wall, and each pair of opposed plates on the rim being connected in an oscillating circuit; and
      signal processing means for generating and processing signals from said oscillating circuits relating to the capacitances of said capacitors, said signals being indicative of the reasonance frequencies of said oscillating circuits.

2. The apparatus of claim 1 wherein said signal processing means includes a counter which is successively advanced stepwise by the signal from each one of the different oscillating circuits, and a storage device into which the contents of the counter is transferred after each complete advancement of the counter caused by an oscillating circuit.

3. The apparatus of claim 1, wherein the signal processing means includes a counter and a gate element for each pair of plates, each counter being advanced stepwise by the associated oscillating circuit when the respective gate element is enabled, and wherein said guide rails includes at least one of an optically or electronically readable marking for enabling said gate elements.

* * * * *